United States Patent [19]
Barron et al.

[11] Patent Number: 5,963,788
[45] Date of Patent: Oct. 5, 1999

[54] METHOD FOR INTEGRATING MICROELECTROMECHANICAL DEVICES WITH ELECTRONIC CIRCUITRY

[75] Inventors: Carole C. Barron, Austin, Tex.; James G. Fleming; Stephen Montague, both of Albuquerque, N.Mex.

[73] Assignee: Sandia Corporation, Albuquerque, N.Mex.

[21] Appl. No.: 08/974,586

[22] Filed: Nov. 19, 1997

Related U.S. Application Data

[63] Continuation-in-part of application No. 08/524,700, Sep. 6, 1995, Pat. No. 5,798,283.

[51] Int. Cl.$^6$ .................................................. H01L 21/00
[52] U.S. Cl. .............................. 438/48; 438/50; 438/53; 148/DIG. 105
[58] Field of Search .................................. 438/48, 50, 51, 438/52, 53, 199, 200, 691, 654, 644; 148/DIG. 105

[56] References Cited

U.S. PATENT DOCUMENTS

| | | | |
|---|---|---|---|
| 4,562,092 | 12/1985 | Wiech | 427/58 |
| 4,859,629 | 8/1989 | Reardon | 437/203 |
| 5,095,401 | 3/1992 | Zayracky | 361/283 |
| 5,227,335 | 7/1993 | Holschwander et al. | 438/654 |

(List continued on next page.)

FOREIGN PATENT DOCUMENTS 4-357854  10/1992  Japan .

OTHER PUBLICATIONS

W. Yun, *CMOS Metallization for Integration with Micromachining Processes,* Thesis for Master of Science Degree in Electrical Engineering from the University of California, Berkley, May 19, 1989.

W. Riethmuller, W. Benecke, U. Schnakenberg, and B. Wagner, "A Smart Accererometer with On–Chip Electronics Fabricated by a Commercial CMOS Process," *Sensors and Actuators A,* vol. 31, pp. 121–124, 1992.

W. Kuehnel and S. Sherman, "A Surface Micromachined Silicon Accelerometer with On–Chip Detection Circuitry," *Sensors and Acuators A,* vol. 45, pp. 7–16, 1994.

R. T. Howe, "Polysilicon Integrated Microsystems: Technologies and Applications," *Digest of Technical Papers for the 8th International Conference on Solid–State Sensors and Actuators and Eurosensors IX,* Stockholm, Sweden, Jun. 25–29, 1995, vol. 1, pp. 43–46, 1995.

P. J. Ireland, "High Aspect Ratio Contacts: A Review of the Current Tungsten Plug Process," *Thin Solid Films,* vol. 304, pp. 1–12, 1997.

S. Wolf, Silicon Processing fro the VLSI Era, vol. 2, pp. 247–251, 1990.

*Primary Examiner*—Michael Trinh
*Attorney, Agent, or Firm*—John P. Hohimer

[57] ABSTRACT

A method is disclosed for integrating one or more microelectromechanical (MEM) devices with electronic circuitry on a common substrate. The MEM device can be fabricated within a substrate cavity and encapsulated with a sacrificial material. This allows the MEM device to be annealed and the substrate planarized prior to forming electronic circuitry on the substrate using a series of standard processing steps. After fabrication of the electronic circuitry, the electronic circuitry can be protected by a two-ply protection layer of titanium nitride (TiN) and tungsten (W) during an etch release process whereby the MEM device is released for operation by etching away a portion of a sacrificial material (e.g. silicon dioxide or a silicate glass) that encapsulates the MEM device. The etch release process is preferably performed using a mixture of hydrofluoric acid (HF) and hydrochloric acid (HCI) which reduces the time for releasing the MEM device compared to use of a buffered oxide etchant. After release of the MEM device, the TiN:W protection layer can be removed with a peroxide-based etchant without damaging the electronic circuitry.

43 Claims, 13 Drawing Sheets

U.S. PATENT DOCUMENTS

| | | | |
|---|---|---|---|
| 5,242,839 | 9/1993 | Oh | 437/5 |
| 5,260,596 | 11/1993 | Dunn | 257/414 |
| 5,314,572 | 5/1994 | Core | 156/643 |
| 5,326,726 | 7/1994 | Tsang | 437/228 |
| 5,345,824 | 9/1994 | Sherman | 73/517 B |
| 5,399,415 | 3/1995 | Chen | 428/209 |
| 5,412,265 | 5/1995 | Sickafus | 310/40 MM |
| 5,417,111 | 5/1995 | Sherman | 73/517 R |
| 5,427,975 | 6/1995 | Sparks | 437/79 |
| 5,431,051 | 7/1995 | Biebl | 73/517 B |
| 5,431,057 | 7/1995 | Zimmer | 73/724 |
| 5,455,203 | 10/1995 | Koseki | 437/228 |
| 5,493,177 | 2/1996 | Muller et al. | 313/578 |
| 5,504,026 | 4/1996 | Kung | 437/51 |
| 5,550,090 | 8/1996 | Ristic | 437/228 |
| 5,798,283 | 8/1998 | Montague et al. | 438/50 |
| 5,814,554 | 9/1998 | De Samber et al. | 438/50 |

METHOD FOR INTEGRATING MICROELECTROMECHANICAL DEVICES WITH ELECTRONIC CIRCUITRY

CROSS REFERENCE TO RELATED APPLICATIONS

This is a continuation-in-part of application Ser. No. 08/524,700, filed Sep. 6, 1995, now U.S. Pat. No. 5,798,283. This invention is further related to applications Ser. No. 08/903,985, filed on Jul. 31, 1997, now U.S. Pat. No. 5,783,340 and Ser. No. 08/915,071, filed on Aug. 20, 1997, pending, both of which are incorporated herein by reference.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to methods for fabricating microelectromechanical devices. In particular, the invention is directed to a method for integrating microelectromechanical devices with electronic circuitry on a substrate.

BACKGROUND OF THE INVENTION

Microelectromechanical (MEM) devices have applications for forming many and varied types of microsensors and microactuators. The monolithic integration of MEM devices with electronic circuitry offers the possibility for increasing performance (e.g. forming "smart sensors" having driving, control, and signal processing circuitry formed therewith on a substrate, also termed a wafer or chip) and reliability as well as significantly reducing size and cost. Furthermore, the sensitivity of many types of microsensors (e.g. accelerometers) can be improved by a reduced noise level provided by on-chip circuitry.

U.S. Pat. No. 5,326,726 to Tsang et al discloses an interleaved or merged process approach for fabricating a monolithic chip containing integrated circuitry interconnected to a microstructure (i.e. a MEM device). The approach of Tsang et al requires that the separate steps for forming the MEM device and the integrated circuit be interleaved for compatibility, with the electronic circuitry being formed at least in part prior to the MEM device, and electrical interconnections between the circuitry and the MEM device being formed thereafter. While Tsang et al use some essentially standard process steps, other process steps must be modified due to conflicting requirements between the circuitry and MEM devices.

These modified process steps are primarily dictated by thermal cycles and topography during processing which are largely responsible for determining a strategy for developing a merged or interleaved approach for integrating MEM devices with electronic circuitry. As an example, "islands" of severe topography can be formed by MEM devices extending upward several microns above the substrate, requiring modifications to photolithography and etching processes for forming electrical interconnections between the MEM devices and circuitry. Such modification of process steps to the extent that it deviates from standard processing steps is disadvantageous and costly in requiring that the modified process steps be adapted to a particular type of MEM device, and altered for fabrication of other types of MEM devices. The development of non-standard process steps for forming electronic circuitry that are dictated by requirements of a particular MEM device is disadvantageous in requiring a lengthy period of time for process modification or re-engineering, thereby preventing rapid prototyping of different MEM technologies or MEM development work. Furthermore, since process steps for forming electronic circuitry (e.g. comprising CMOS transistors) are well established and standardized, any modification of the process steps can significantly decrease the circuit performance and the overall process yield.

What is needed is a method for integrating MEM devices with electronic circuitry that substantially separates the process steps for fabricating the MEM devices from the process steps for fabricating the electronic circuitry, thereby allowing the use of standard process steps as known to the art, especially for fabricating the electronic circuitry.

Heretofore, such a separation of steps for fabricating MEM devices and steps for fabricating electronic circuitry has been based on a method of fabricating the electronic circuitry prior to fabrication of the MEM devices in a circuitry-first approach. This approach has been primarily motivated by concerns about contamination and a rough topography that is generally thought to be inevitable if the MEM devices were fabricated first. A rough topography places severe demands on subsequent lithography and etching processes for forming the electronic circuitry. The use of a circuitry-first approach, however, is disadvantageous in requiring deviations from standard processing steps (i.e. process modifications), especially in requiring the use of tungsten instead of aluminum for the interconnect metallization to withstand a high-temperature annealing step required to at least partially relieve stress in polysilicon elements (e.g. cantilevered beams) of MEM devices. However, the use of tungsten as an interconnect metallization is not altogether satisfactory, resulting in additional problems including a high contact resistance and hillock formation that can lead to inadequate protection of the electronic circuitry during release of the MEM devices. Additional problems known to occur with this circuitry-first approach include an undesirable formation of tungsten silicides, and poor adhesion of the tungsten interconnect metallization.

An advantage of the method of the present invention is that microelectromechanical (MEM) devices can be integrated with electronic circuitry on a substrate while using standard process steps with little if any modification for fabricating the electronic circuitry, including the use of an aluminum interconnect metallization in preferred embodiments of the present invention.

Another advantage of the present invention is that one or more MEM devices can be fabricated prior to fabrication of electronic circuitry, with the MEM devices being encapsulated to prevent contamination of a device surface of the substrate.

A further advantage of the present invention is that the substrate can be planarized prior to formation of the electronic circuitry thereby providing a substantially smooth and planar surface topography for subsequent process steps for fabricating the electronic circuitry.

Still another advantage of the present invention is that the encapsulated MEM devices can be annealed under temperature and time conditions sufficient to relieve strain in elements of the MEM devices prior to formation of the electronic circuitry including the interconnect metallization.

Yet another advantage is that by providing one or more encapsulated MEM devices formed within a cavity below a device surface of a planarized substrate, the substrate can be handled and processed thereafter using substantially standard process steps with little if any modification for forming the electronic circuitry (including the interconnect metallization).

Another advantage of the present invention is that the electronic circuitry can be protected during an etching step for releasing the encapsulated MEM device by covering the electronic circuitry with a layer of deposited tungsten that can be removed without damaging the underlying electronic circuitry after the MEM device is released.

Yet another advantage of the method of the present invention is that packaging of both MEM and integrated devices (i.e. MEM devices integrated with electronic circuitry) can be simplified and cost reduced by forming one or more of the MEM devices below a device surface of a substrate with an overlying layer forming at least a part of an enclosure for packaging the devices.

These and other advantages of the method of the present invention will become evident to those skilled in the art.

SUMMARY OF THE INVENTION

The present invention relates to a method for integrating one or more microelectromechanical (MEM) devices with electronic circuitry on a common substrate. The method comprises steps for etching a cavity within a first portion of the substrate; fabricating the MEM device within the cavity, and filling the cavity with one or more layers of a sacrificial material; fabricating the electronic circuitry comprising a plurality of transistors within a second portion of the substrate proximate to the first portion, and interconnecting the electronic circuitry to the MEM device; protecting the electronic circuitry by depositing a layer of tungsten to blanket the second portion of the substrate and to cover the electronic circuitry; and releasing the MEM device for operation thereof by removing at least a portion of the sacrificial material filling the cavity by etching the sacrificial material with a first wet etchant which does not substantially remove the layer of tungsten protecting the electronic circuitry. In preferred embodiments of the present invention, the step for protecting the electronic circuitry further comprises a step for depositing an adhesion layer (e.g. comprising titanium nitride) over the second portion of the substrate prior to the step for depositing the layer of tungsten. The method of the present invention can further comprise a step for removing the layer of tungsten (and the adhesion layer, if present) after the step for releasing the MEM device.

The substrate preferably comprises silicon; and the step for etching the cavity within the first portion of the substrate can comprise either etching the cavity into the substrate, or etching the cavity into one or more semiconductor layers formed on the substrate. The step for fabricating the MEM device can comprise steps for depositing, patterning and etching layers of one or more micromachineable materials selected from the group consisting of polycrystalline silicon (also termed polysilicon), silicon dioxide, silicon nitride, silicate glass, metals and metal alloys. The step for filling the cavity with a sacrificial material preferably comprises depositing a silicate glass within the cavity.

In preferred embodiments of the present invention, the step for fabricating the MEM device can include a step for annealing the MEM device, thereby relieving stress in the MEM device. The step for fabricating the MEM device can further include a step for planarizing the substrate (e.g. by a chemical-mechanical polishing step) prior to the step for fabricating the electronic circuitry.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

The fabrication method of the present invention combines processes for fabricating one or more microelectromechanical (MEM) devices with processes for fabricating electronic circuitry in a mutually compatible manner. The electronic circuitry can comprise complementary metal-oxide semiconductor (CMOS) transistors, bipolar complementary metal-oxide semiconductor (BiCMOS) transistors, or bipolar transistors. The integration of the MEM devices with electronic circuitry provides added functionality for driving and control of microactuators (i.e. MEM devices providing some form of actuation, including linear and rotary motors, gears, levers, linkages and the like) and provides a means for amplifying and/or processing (including compensation, linearization, and control) of sensory signals generated by microsensors (i.e. MEM devices responding to some form of external applied stimuli, including accelerometers, pressure sensors, flow sensors, chemical sensors, optical sensors, resonant oscillators and the like). Such integration provides advantages in terms of increased functionality and sensitivity, and reduced size and cost as compared to MEM devices being formed on a separate chip from the electronic circuitry.

Figure 1:
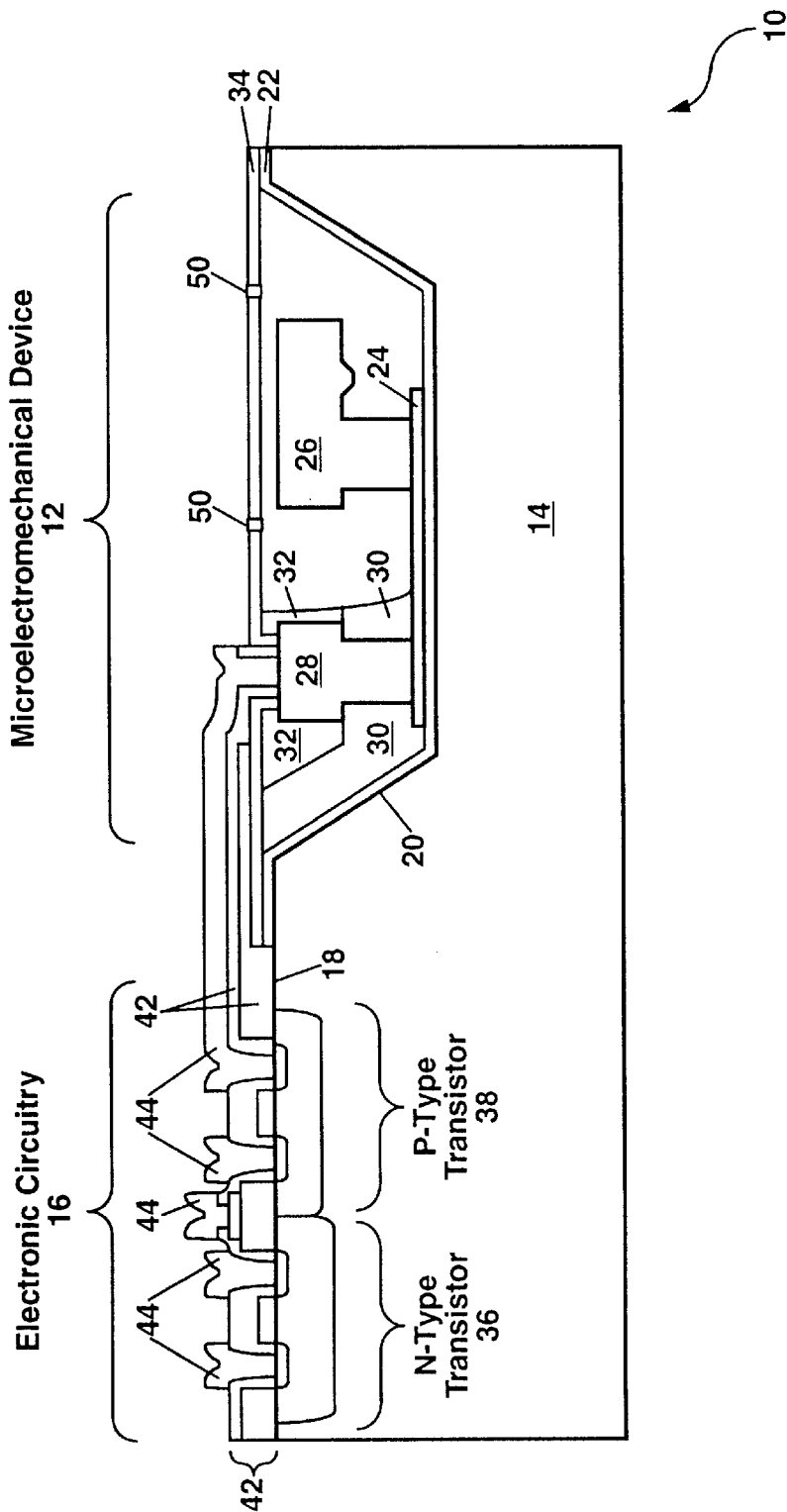
FIG. 1 shows a schematic cross-sectional representation of an integrated device 10 having one or more MEM devices integrated with electronic circuitry according to the method of the present invention.

Referring to FIG. 1, there is shown a schematic cross-section representation of an example of an integrated device 10 comprising at least one microelectromechanical (MEM) device 12 fabricated on a first portion of a common substrate 14 and electrically connected to electronic circuitry 16 fabricated on a second portion on the substrate proximate to the first portion. In the example of FIG. 1, the first portion of the substrate 14 lies below the bracket and label "Microelectromechanical Device 12"; whereas the second portion lies below the bracket and label "Electronic Circuitry 16".

The process steps for forming such an integrated device 10 in the example of FIG. 1 are shown in FIGS. 2–13, and described hereinafter. Although the example of the MEM device 12 is described in FIGS. 1–13 as being formed within a cavity 20, it will be understood by those skilled in the art that, in some embodiments of the present invention, the completed MEM device 12 can extend upward beyond the cavity 20. In particular, for forming pressure sensors, a moveable pressure sensing diaphragm can be formed over the cavity 20 to cover and seal the cavity 20, with polysilicon piezoresistors then being formed above the pressure diaphragm for measuring changes in pressure or vacuum. Thus, although the MEM device 12 is generally described as being located within the cavity 20, in some instances, the cavity 20 itself can form a part of the MEM device 12, as in the case of a pressure sensor.

Figure 2:
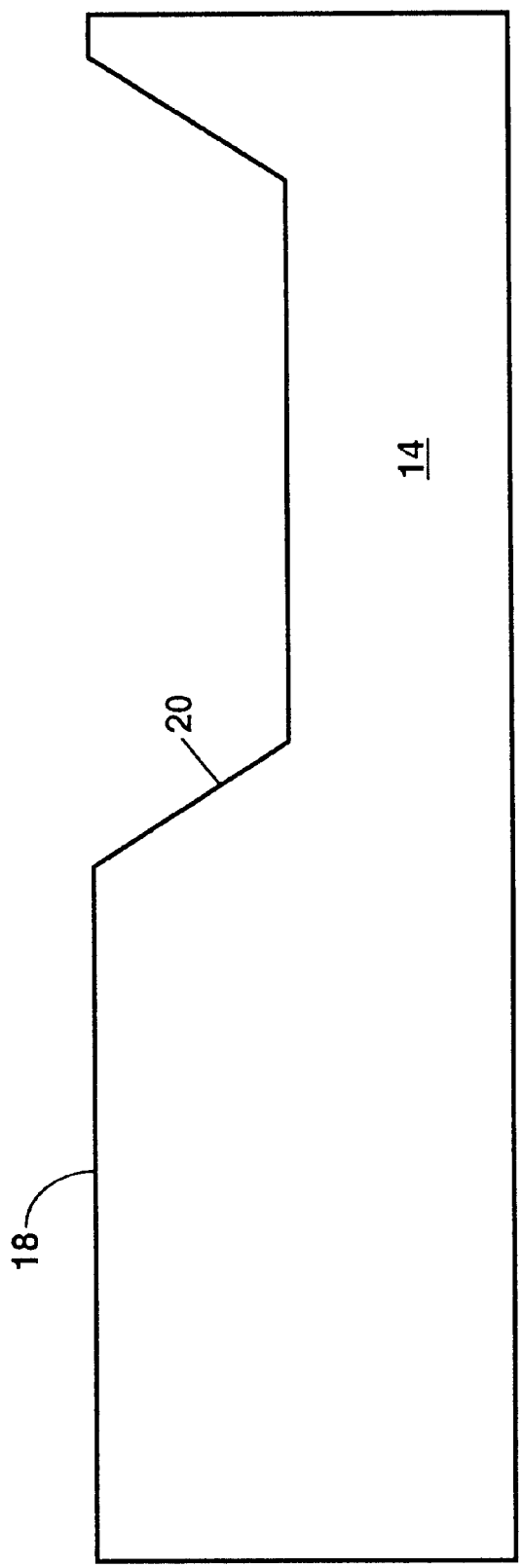
FIGS. 2–13 show schematic cross-section representations of the integrated device of FIG. 1 during various process steps for forming the integrated device.

In FIG. 2, a substrate 14 is provided for formation of the integrated device 10. The substrate 14 preferably comprises a monocrystalline silicon wafer or a portion thereof. The substrate 14 can be undoped, or n- or p-type doped depending on a predetermined set of standard processes (and including design rules) to be used for forming the electronic circuitry 16. As an example, an n-type doped substrate 14 can be preferred for forming electronic circuitry 16 by a set of standard CMOS process steps having 2-micron ($\mu$m) design rules (i.e. a 2-$\mu$m minimum feature size). As another example, a p-type doped substrate can be preferred for forming electronic circuitry 16 by another set of standard CMOS processing steps having 0.5-$\mu$m design rules. The substrate 14 can further include one or more semiconductor layers formed or epitaxially deposited thereon (including doped layers) with a total layer thickness of about 2–10 $\mu$m or more for providing a smooth low-defect-density device surface 18 for formation of the electronic circuitry 16. (A buried doped epitaxial layer can be provided for forming BiCMOS or bipolar transistors for forming the electronic circuitry 16.)

In FIG. 2, one or more open cavities 20 are etched into the device surface 18 of the substrate at predetermined locations (i.e. the first portion of the substrate) wherein each MEM device 12 is to be fabricated. The size of each cavity 20 including its length, width and depth, will in general depend on the particular type of MEM device 12 to be formed. The length and width can each be on the order of one millimeter, for example, and the depth can be in the range of about 2–20 $\mu$m.

Each cavity 20 is preferably formed by a bulk micromachining process after providing a patterned first masking layer (e.g. about 500 nanometers of a silicate glass deposited from the decomposition of tetraethylortho silicate, also termed TEOS, that has been densified by heating to a high temperature for a specified period of time) covering the device surface 18 with openings at the locations of each cavity to be formed. Each cavity 20 is then etched into the substrate using a wet and/or dry etching process. A preferred etching process uses an anisotropic wet etchant such as potassium hydroxide (KOH), tetramethyl ammonium hydroxide (TMAH) or ethylenediamine pyrocatechol (EDP) to form one or more cavities 20 that can be, for example, about 2–20 $\mu$m or more deep with a substantially planar bottom surface and sloping inner sidewalls formed by selective etching along preferred (111) crystallographic planes as shown in FIG. 2. The use of an anisotropic etchant can be advantageous for providing improved optical access to the bottom surface of each cavity thereby providing an increased latitude for subsequent photolithography steps for forming elements of the MEM structure within each cavity (including providing alignment marks on the bottom surface of the cavity). After formation of one or more cavities on the substrate, the patterned first masking layer can be removed with a wet etchant comprising HF.

Figure 3:
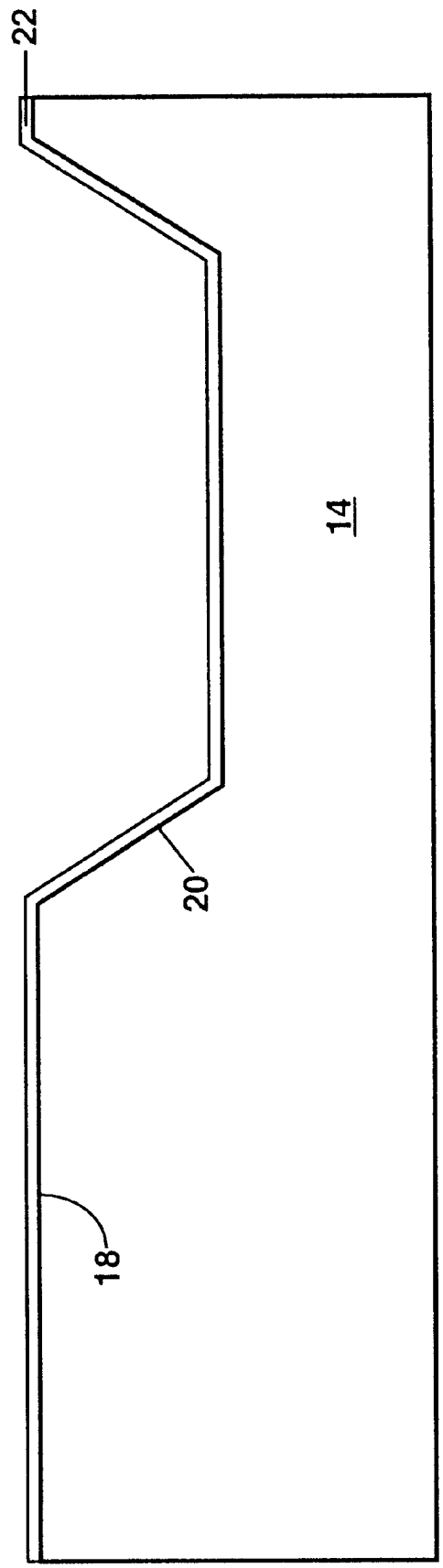

In FIG. 3, a first silicon nitride layer 22 is deposited to blanket the device surface 18 and each cavity 20 after first forming a thin blanket layer of a thermal oxide (approximately 60 nanometers of silicon dioxide formed by a thermal diffusion process) to protect the bare silicon from exposure to the first silicon nitride layer 22. The first silicon nitride layer 22 can be up to about 200–300 nanometers thick, and is preferably formed by a low-pressure chemical vapor deposition (CVD) process that produces low residual stress in the first silicon nitride layer 22. The portion of the first silicon nitride layer 22 extending above the device surface 18 can later be used as a stop for a chemical-mechanical polishing process for planarizing a top side of the substrate; and the remainder of the first silicon nitride layer 22 covering the inner surfaces of each cavity 20 serves as a dielectric isolation layer, and also as an etch stop during an etching step for releasing the MEM device 12 after fabrication of the electronic circuitry.

Figure 4:
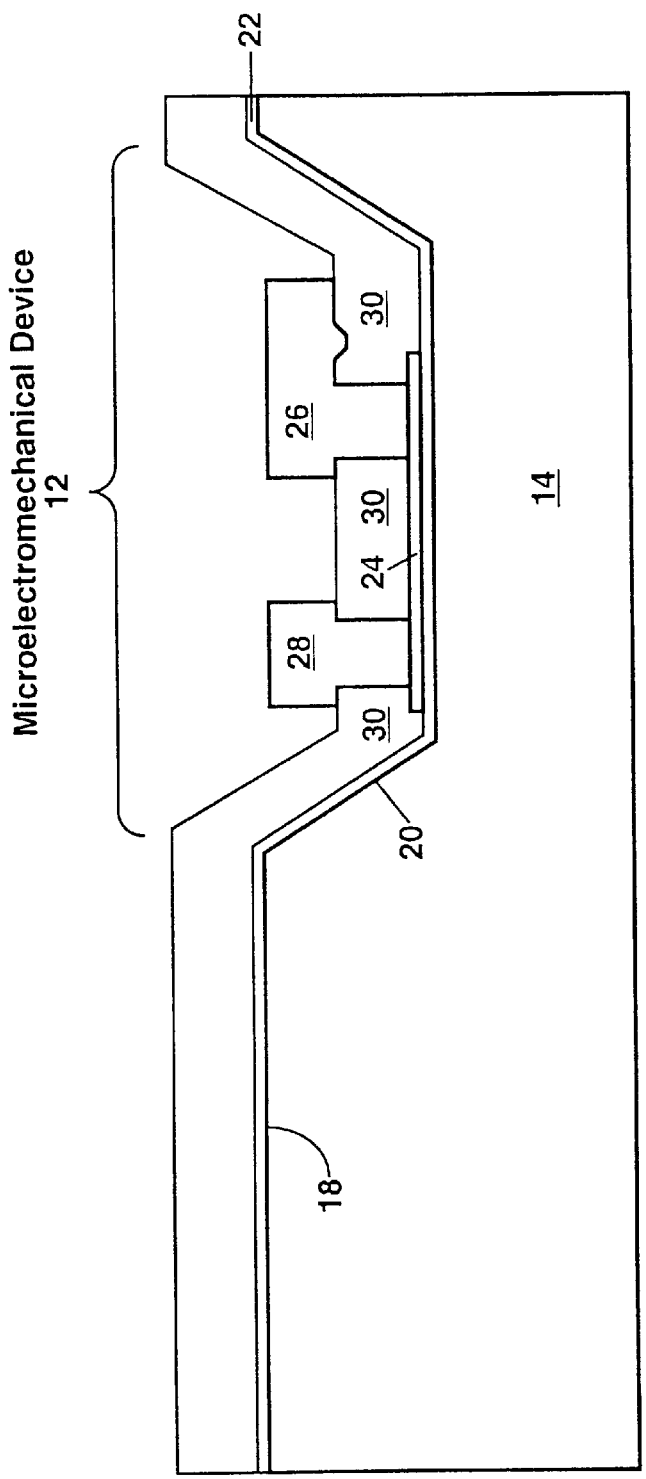

In FIG. 4, one or more MEM devices 12 are formed within each cavity 20 in the first portion of the substrate 14, with the MEM devices 12 preferably being located substantially below the device surface 18 of the substrate 14. Formation of the MEM devices can include surface and bulk micromachining processes as known to the art. In surface micromachining processes, for example, one or more thin films (up to a few microns thick) of micromachineable materials such as polysilicon, silicon nitride (also termed nitride), silicon dioxide (also termed oxide), metals (e.g. tungsten, gold, copper, platinum, nickel, palladium), metal alloys (including metal silicides) and the like can be deposited within the cavity through patterned masking layers and anisotropically etched to form the MEM devices 12. One or more sacrificial layers comprising a sacrificial material such as silicon dioxide or one or more silicate glasses as can be deposited by a CVD process. After formation of the electronic circuitry 16 on the second portion of the substrate 14, the sacrificial material can be removed, at least in part, from each cavity 20 for releasing the MEM devices 12 for movement or operation. Bulk micromachining processes including LIGA (a German acronym taken from words referring to lithography, electroplating and injection molding) can be used to form MEM devices 12 having larger vertical dimensions (up to 300 $\mu$m or more), and with minimum feature sizes down to about 2 $\mu$m.

FIG. 4 shows an example of a MEM device 12 comprising a first-deposited polysilicon layer 24 that is preferably doped (e.g. by an ion implantation and/or thermal diffusion step, or in-situ by chemical vapor deposition) and patterned for forming a voltage reference plane and for providing electrical interconnections between elements of the MEM device. In FIG. 4, additional polysilicon layers can be deposited and patterned by any conventional method to form one or more fixed support beams 26, moveable support beams (not shown), electrical interconnection studs 28, or the like having predetermined forms or shapes depending on a particular MEM device 12 to be fabricated. A single additional polysilicon layer can be provided above the first polysilicon layer 24 when simple MEM devices 12 such as accelerometers based on capacitively-coupled cantilevered beams are to be formed according to the present invention.

For more complex MEM devices, however, further polysilicon layers are generally required. For example, a preferred process for forming complex, interconnected, interactive, microactuated MEM devices 12 having springs, linkages, mass elements, joints and the like generally requires the deposition and patterning of three additional layers of polysilicon above the first polysilicon layer 24, with each of the polysilicon layers being separated by a sacrificial layer (e.g. a thin oxide or silicate glass layer) and/or by a friction-reduction nitride layer (e.g. for forming bearing surfaces for moveable elements such as gears, rotors, levers, linkages etc.). This preferred three-layer process is advantageous for mechanically interconnecting elements of a MEM device 12 by hard linkages for actuation, or for coupling mechanical energy via micromachined gears, levers, linkages or the like. Furthermore, since each polysilicon layer can be selectively doped for use as an electrical conductor, this preferred three-layer process provides additional flexibility for electrical interconnections and/or electrodes. The additional polysilicon layers can be deposited, at least in part, through one or more patterned sacrificial layers 30 for defining a shape of the MEM elements, and for forming anchor portions for mechanical and electrical connection to the first-deposited polysilicon layer 24.

Figure 5:
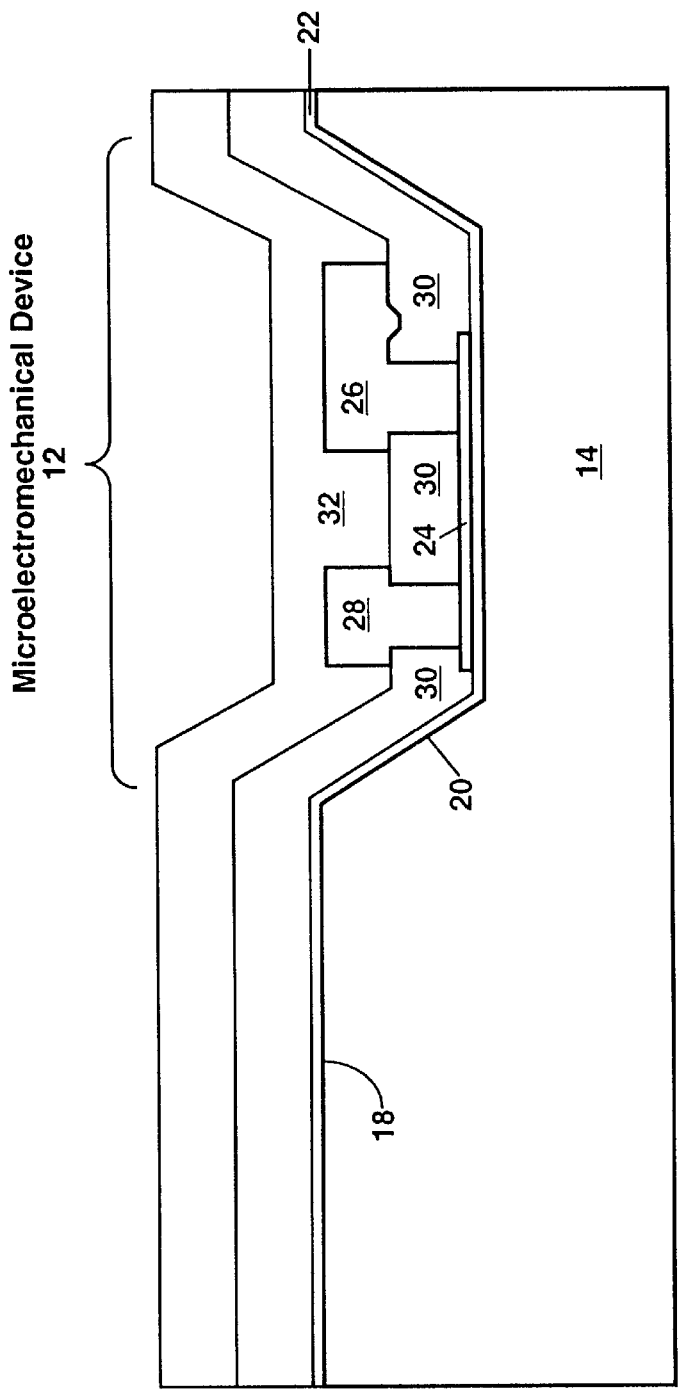

In FIG. 5, after formation of the MEM devices 12 (with the polysilicon layers being formed into their final shapes to define elements of the MEM devices), one or more additional sacrificial layers 32 (comprising the same or different sacrificial materials such as silicon dioxide or silicate glasses that can be later removed by selective etching) can be deposited to fill the cavity 20 and completely bury or encapsulate the MEM devices 12. The steps for depositing the sacrificial material to fill the cavity 20 provide for protection of the MEM devices 12 within the cavity and/or for planarization of the cavity 20 and the substrate 14. The sacrificial layers 30 and 32 can be grown or deposited in a conventional manner (e.g. by CVD wherein an oxide or silicate glass layer-forming gas is decomposed to form the layers 30; or by plasma-enhanced CVD, also termed PECVD, wherein applied rf power is provided to assist the decomposition for deposition at a low temperature of about 600° C. or less), with each layer thickness being tailored to particular requirements of the MEM devices 12 being formed.

Figure 6:
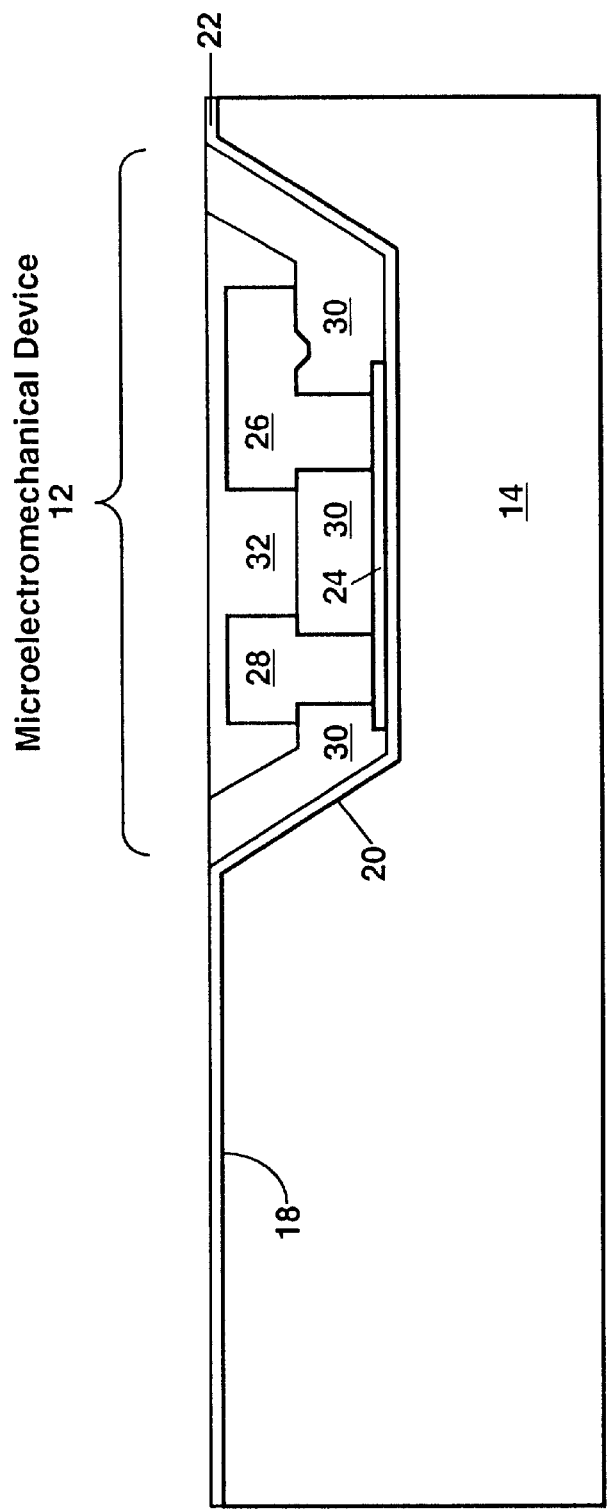

The additional sacrificial layers 32 are preferably deposited so as to extend upward beyond the device surface 18 and most preferably beyond the first silicon nitride layer 22 as shown in FIG. 5, thereby allowing a step for planarizing the substrate. In FIG. 6, the substrate planarization step is preferably performed by chemical-mechanical polishing a top side of the substrate. To reduce the time required for chemical-mechanical polishing of the substrate, a preferable method for planarizing the substrate is to mask the first region of the substrate 14 above the cavity 20 with a mask layer (e.g. a patterned photoresist layer) and to remove the sacrificial layers 30 and 32 covering the remainder of the substrate 14 by a dry etching step. During the substrate planarization step, the first silicon nitride layer 22 is preferably used as a polishing stop to limit a downward extent of the chemical-mechanical polishing, thereby providing a substantially planar upper surface for the substrate. After the chemical-mechanical polishing step, the silicon nitride layer 22 in acting as a polishing stop can be reduced to about 100–300 nanometers thickness.

After planarization of the substrate 14, a second silicon nitride layer (i.e. a cap layer) 34 can be deposited over the planar upper surface of the substrate covering the remaining portion of the first silicon nitride layer 22 and any exposed portions of the sacrificial layers 30 and 32, thereby forming a nitride-to-nitride seal for sealing the encapsulated MEM devices 12. After this sealing step has been performed, the electronic circuitry 16 can be fabricated within the second portion of the substrate 14 according to conventional methods (i.e. standard process steps with little if any modification thereof as known to the art for forming CMOS, BiCMOS, or bipolar transistors). The sealed substrate can even be shipped to a foundry or other entity for fabrication of the electronic circuitry 16 by a set of standard process steps.

Since any stress within elements of the MEM devices 12 (e.g. polysilicon cantilevered beams) can be detrimental to operation of the device, an annealing step for relieving the stress is preferably performed. This annealing step can be performed before fabrication of the electronic circuitry 16 by heating the substrate and encapsulated MEM devices to a preselected temperature in the range of about 700–1300° C. for a time period of up to about three hours or more depending upon the level of stress to be relieved. Alternately, the annealing step can be performed during a thermal cycle used for fabricating the electronic circuitry 16 (e.g one or more thermal diffusion steps for forming transistors).

Figure 7:
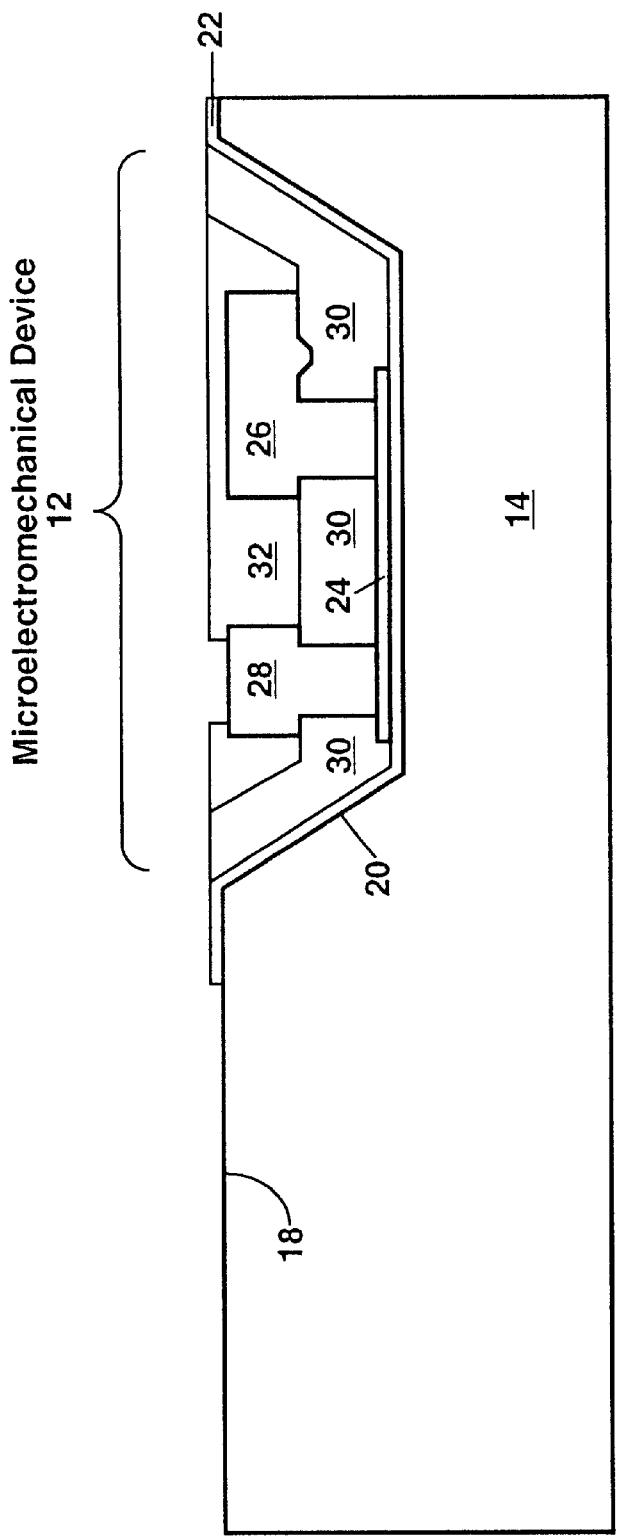

In some cases, the formation of the electronic circuitry 16 can begin immediately after planarizing the substrate 14, with the second silicon nitride layer 34 being deposited during a standard process step for forming the electronic circuitry 16. In this case shown schematically in FIGS. 7–13 and described hereinafter with reference to a preferred process for forming CMOS circuitry 16 (i.e. circuitry comprising a plurality of complementary metal-oxide semiconductor transistors), the first silicon nitride layer 22 and the underlying thermal oxide are preferably removed by etching in the second portion of the substrate (see FIG. 7) to provide a bare portion of the substrate 14 upon which new thermal oxide and silicon nitride layers can be formed with precise thicknesses for carrying out a set of standard processes for forming the CMOS circuitry 16. For certain interconnect metallization schemes, this process of removing the first silicon nitride layer 22 and the underlying oxide and forming the new thermal oxide and silicon nitride layers is to be preferred for reducing or eliminating metallization step coverage problems. During these standard process steps for forming the electronic circuitry 16, openings can also be made to each polysilicon stud 28 as shown in FIG. 7 for later use in forming electrical interconnections between the electronic circuitry 16 and each MEM device 12.

Figure 8:
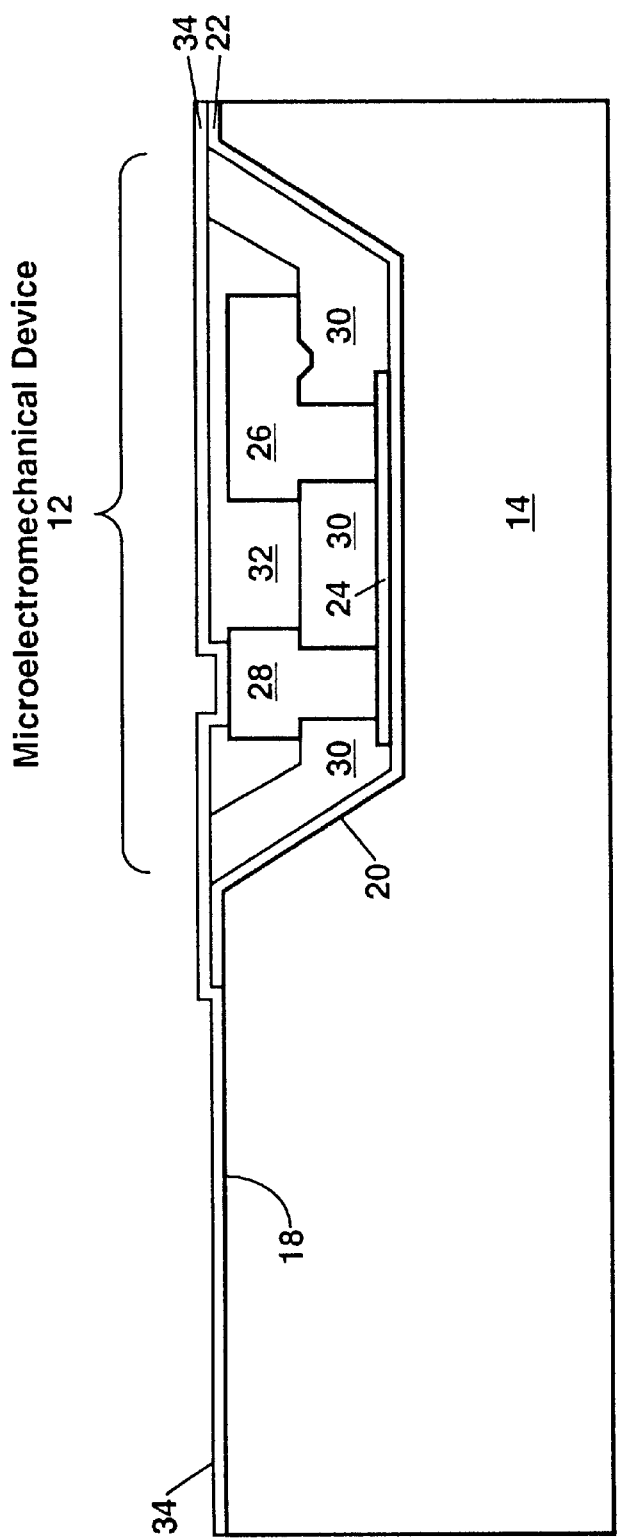
Figure 9:
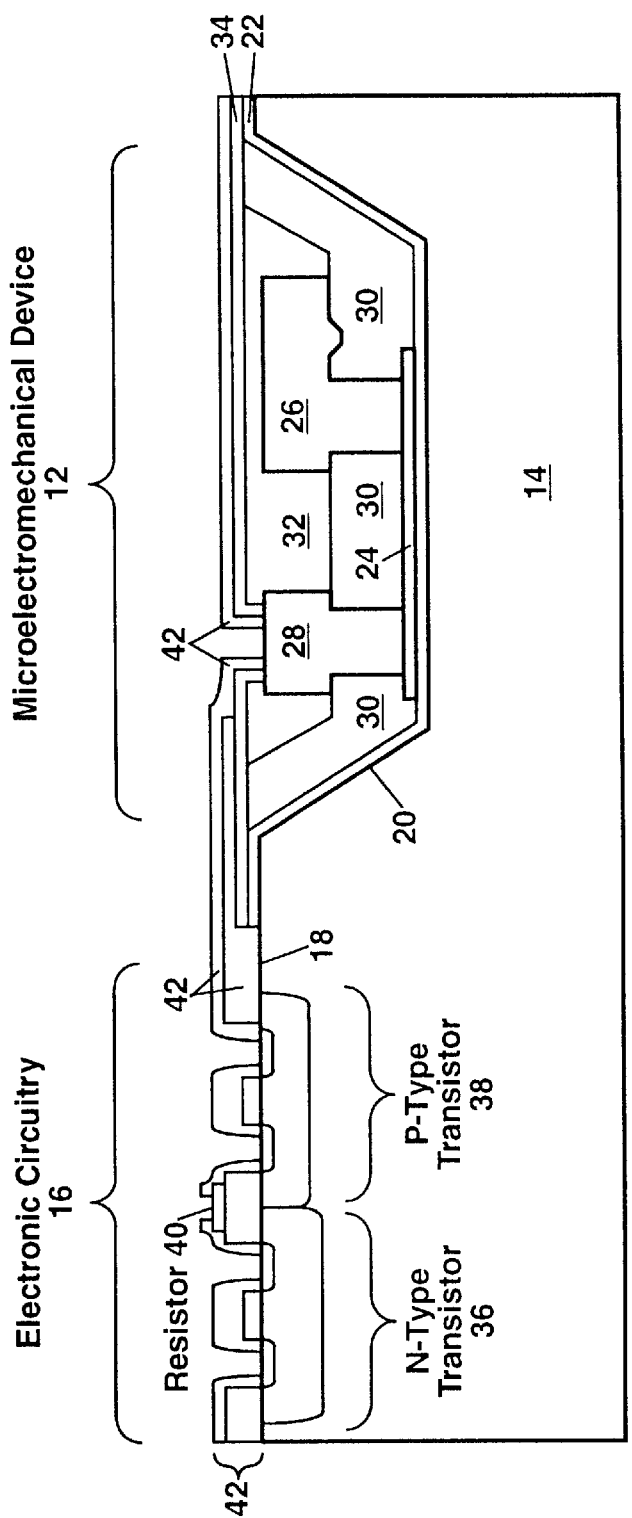

In FIG. 8, after formation of a new thermal oxide layer (about 30–40 nanometers thick) on the exposed device surface 18, a second silicon nitride layer 34 (i.e. the new silicon nitride layer which is also termed a cap layer) can then be deposited over the entire upper surface of the wafer 14 to a layer thickness of about 120 nanometers, for example, for use in forming the CMOS circuitry 16 and also for use in sealing the cavity 20 containing the encapsulated MEM device 12. In FIG. 9, openings can be formed through the second silicon nitride layer 34 for forming n-type and p-type isolation wells (also termed tubs) by ion implantation and thermal diffusion steps. Subsequent standard CMOS process steps can be used for forming n-type transistors 36 within the p-type wells, and for forming p-type transistors 38 within the n-type wells. Such standard CMOS process steps can include the deposition and patterning of one or more polysilicon layers for forming transistor gates and resistors 40; and the deposition and patterning of a plurality of passivation layers 42 (including, for example, a field oxide layer of CVD silicon dioxide and overlying layers of one or more silicate glasses such as TEOS; phosphorous silicate glass, also termed PSG; or borophosphorous silicate glass, also termed BPSG deposited by CVD or PECVD).

Figure 10:
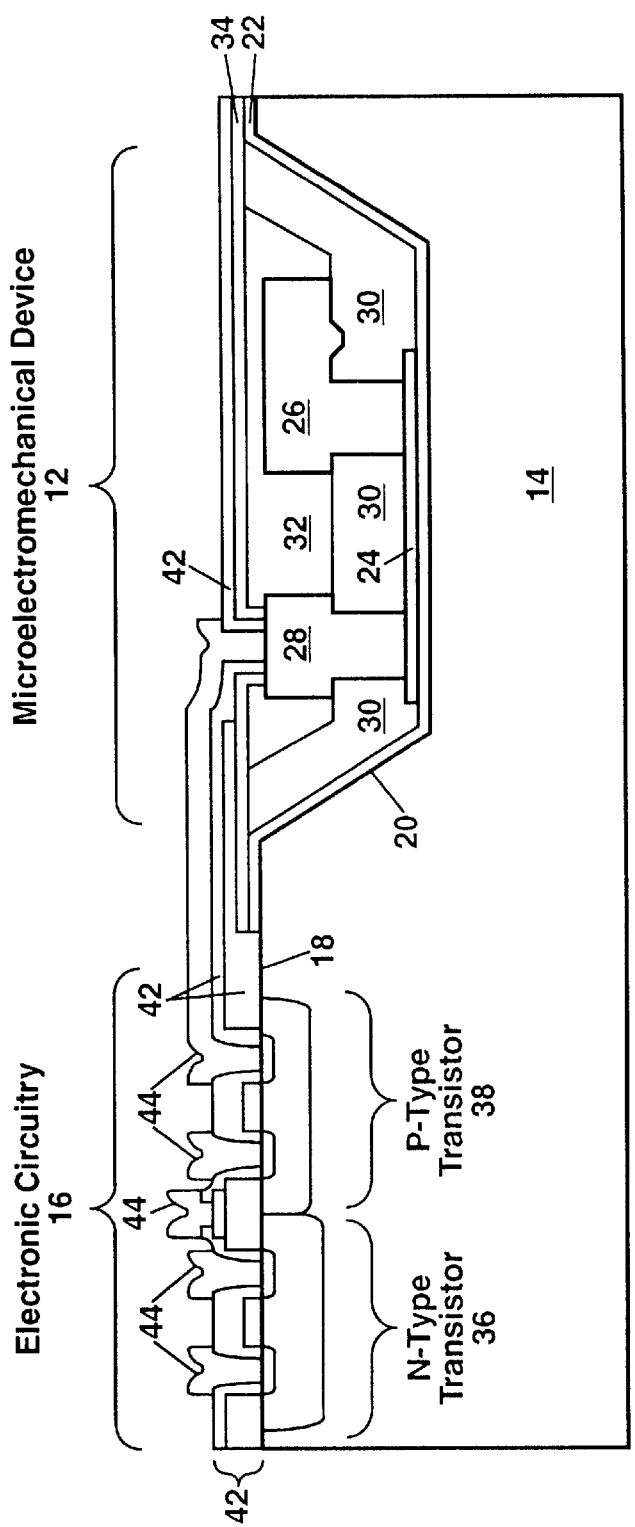

In FIG. 10, one or more layers of an interconnect metallization 44 are provided by standard deposition and patterning steps to interconnect elements (e.g. transistors, resistors, capacitors) forming the electronic circuitry 16, to provide electrical interconnections to the MEM device 12 via the polysilicon studs 28, and to provide a plurality of bonding or contact pads (not shown) for providing electrical connections to form a packaged integrated device 10. The interconnect metallization 44 is considered herein to form a part of the electronic circuitry 16.

Aluminum or an alloy thereof is preferred for use as the interconnect metallization 44, although other metals (e.g tungsten, gold, copper, platinum, nickel, palladium), metal alloys (including metal silicides) and even doped polysilicon can be used for the electrical interconnections depending upon operating requirements for the integrated devices 10, and a particular set of standard process steps to be used for practice of the present invention. Additional passivation layers (e.g. about 200 nanometers of a silicate glass such as plasma-enhanced TEOS, also termed PETEOS) can be provided to separate a plurality of layers of the interconnect metallization 44 (not shown in FIG. 10), and to blanket the electronic circuitry 16 and interconnect metallization for environmental protection and stress relief.

Figure 11:
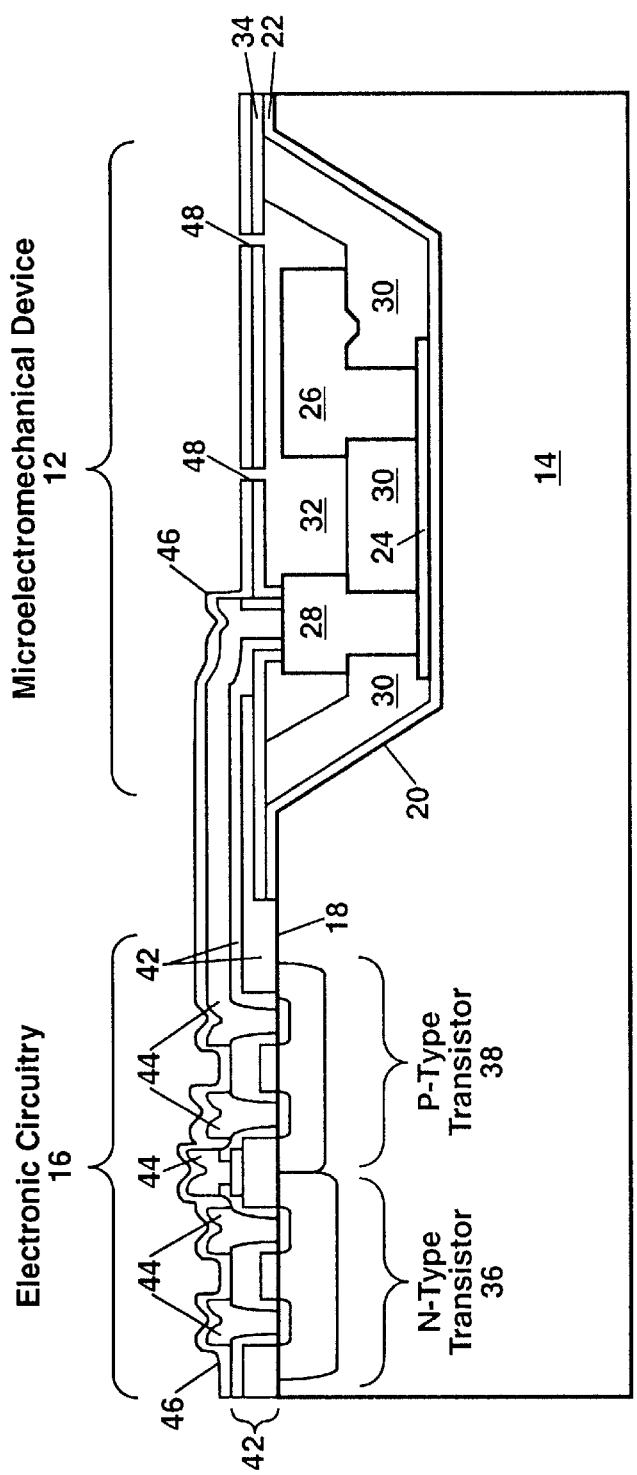

After fabrication of the electronic circuitry is substantially completed, a protection layer 46 preferably comprising tungsten is deposited to blanket the second portion of the substrate 14 and cover the electronic circuitry 16 for protection of the electronic circuitry 16 during an etch release process step whereby the MEM device 12 is exposed to an etchant for removing the sacrificial material, at least in part, and releasing the MEM device 12 into its final suspended state for movement or operation. As shown in FIG. 11, the protection layer 46 can also be deposited to blanket the first portion of the substrate 14 containing the MEMS device 12, with one or more etch channels 48 being formed (e.g. by photolithographic patterning and etching) through the protection layer 46 and the second silicon nitride layer 34 to expose the sacrificial material for removal by etching.

The use of a tungsten protection layer 46 is especially preferred when an wet etchant comprising, at least in part, hydrofluoric acid (HF). Particular etchant compositions that can be used according to the present invention for releasing the MEMS device 12 include mixtures of hydrofluoric acid (HF) and hydrochloric acid (HCI), and mixtures of HF and water ($H_2O$). The exact proportions of the constituents in each mixture will depend upon a predetermined etching rate for the sacrificial material which can be determined from practice of the present invention. Such HF:HCI or HF:$H_2O$ wet etchants are advantageous for etching the sacrificial material at a much faster rate as compared with a buffered oxide etchant, thereby substantially reducing the time required for releasing the MEM devices 12. However, use of the HF:HCI or HF:$H_2O$ wet etchants require more substantial protection for the electronic circuitry 16 than is provided by a photoresist protection layer 46 which is generally sufficient for the buffered oxide etchant.

A preferred method for forming the protection layer 46 according to the present invention is to initially deposit (e.g. by sputtering or CVD) a thin layer (e.g. about 50 nanometers thick) of titanium nitride (TiN) over the substrate 14 as an adhesion layer, and then to deposit a thicker layer (e.g. about 0.1–1 microns thick) of tungsten (W) over the titanium nitride layer (e.g. by CVD using $WF_6$ as a source gas). This forms a two-ply protection layer 46 which has a substantial chemical resistance to the HF:HCI or HF:$H_2O$ wet etchants, thereby protecting the electronic circuitry 16 from exposure to the wet etchants which could damage the electronic circuitry 16. The TiN:W protection layer 46 can be removed after the etch release step described hereinafter without damaging the electronic circuitry 16 by exposing the tungsten and titanium nitride layers to another wet etchant having a chemical composition different from the chemical composition of the wet etchant used for releasing the MEM device 12. This wet etchant for removing the TiN:W protection layer 46 can comprise hydrogen peroxide, for example.

Figure 12:
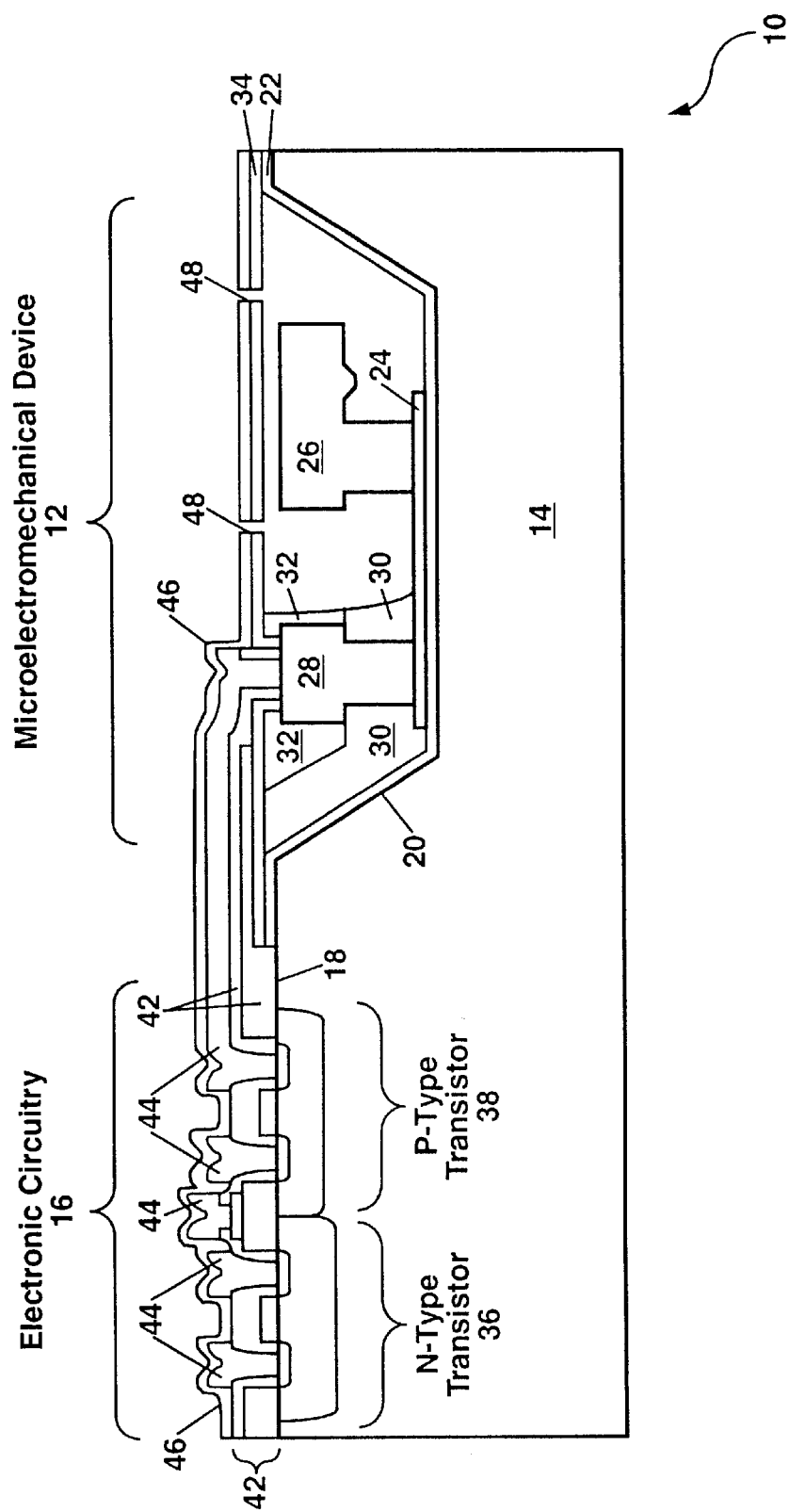

FIG. 12 shows the substrate 14 with integrated MEM device 12 and electronic circuitry 16 after the etch release step in which the sacrificial material (e.g. sacrificial layers 30 and 32) is removed at least in part by the HF:HCI wet etchant or by the HF:$H_2O$ wet etchant. These wet etchant compositions dissolve the sacrificial material, but preferably do not substantially affect (i.e. attack) any other materials (e.g. polysilicon, silicon nitride or metals) used to form the MEM device 12. In order to remove all of the sacrificial material, the etch release step can proceed for up to an hour or longer, depending upon the size, number and location of etch channels 48 provided.

Alternately, the wet etching process step can be limited in time duration so that some of the sacrificial material is left to support the polysilicon studs 28 and/or other fixed structural elements of the MEM devices. In this latter case, factors of the etch release process including the position, number and size of the etch channels 48; the chemical composition of the etchant; and the time for etching can be selected to limit a lateral extent of etching of the sacrificial material, thereby leaving portions of the sacrificial material surrounding the polysilicon studs 28 or the other fixed structural elements of the MEM devices 12.

After this etch release step, the substrate is then preferably washed in a rinse fluid for cleansing thereof, and is dried preferably using one of the stiction-free drying methods known to the art. Additionally, the released MEM devices 12 can be exposed to a stiction-prevention agent as known to the art for reducing possibility for stiction of moveable elements (e.g. cantilevered beams) of the MEM devices 12 during the drying step or afterwards.

Figure 13:
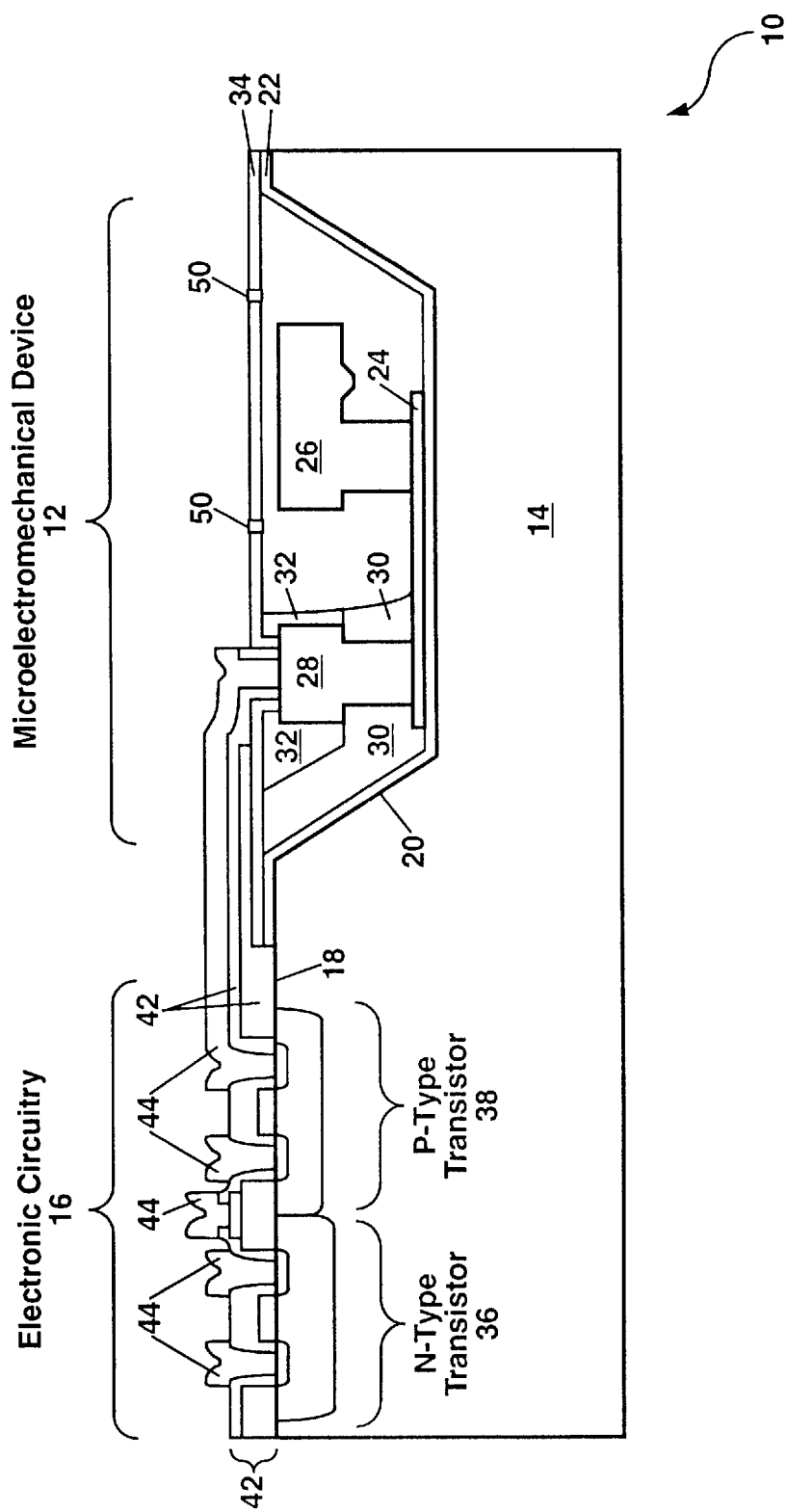

The etch channels 48 in FIGS. 11 and 12 can range in size from about 1–1000 $\mu$m diameter depending on the particular type of MEM device 12 to be formed and also on whether one or more of the etch channels 48 will later be plugged by a deposition step for forming a sealed cavity (e.g. for providing a predetermined level of pressure or vacuum therein, or for forming a pressure sensing diaphragm above the cavity for sensing an ambient or applied pressure or vacuum); or for providing a protected enclosure for the MEM devices, thereby simplifying packaging. This process step for plugging one or more of the etch channels according to some embodiments of the present invention is shown in FIG. 13. By plugging the etch channels 48 with plugs 50 of a deposited material such as PECVD silicon nitride, the MEM devices can be sealed under a near-vacuum condition (about 200 Torr pressure). Alternately, the step of plugging the etch channels 48 can be carried out by sputtering or evaporating a metal (e.g. aluminum), or by low-temperature deposition of a plasma-enhanced oxide or silicate glass.

In some embodiments of the present invention, polysilicon piezoresistors can be formed over a pressure diaphragm formed above the MEM devices by the plugged nitride layer 34 for measuring changes in pressure or vacuum. These process steps for sealing the MEM devices 12 can also be advantageous for packaging the integrated device 10 since the sealed MEM device 12 (with or without plugs 50) is protected from the environment outside the cavity 20, thereby preventing the possibility of damage from dust, and also minimizing possible damage from handling, testing and packaging. The completed device 10 with one or more sealed MEM devices 12 integrated with electronic circuitry 16 can be packaged by any means known to the art including the use of relatively inexpensive molded packages formed of plastics, epoxy or the like.

The matter set forth in the foregoing description and accompanying drawings is offered by way of illustration only and not as a limitation. Other applications and variations of the method for integrating microelectromechanical devices with electronic circuitry will become evident to those skilled in the art. The actual scope of the invention is intended to be defined in the following claims when viewed in their proper perspective based on the prior art.

What is claimed is:

1. A method for integrating a microelectromechanical (MEM) device with electronic circuitry on a substrate comprising steps for:
   (a) etching a cavity within a first portion of the substrate;
   (b) fabricating the MEM device within the cavity, and filling the cavity with a sacrificial material;
   (c) fabricating the electronic circuitry comprising a plurality of transistors within a second portion of the substrate proximate to the first portion, and interconnecting the electronic circuitry to the MEM device;
   (d) protecting the electronic circuitry by depositing a layer of tungsten to blanket the second portion of the substrate and cover the electronic circuitry; and
   (e) releasing the MEM device for operation thereof by removing at least a portion of the sacrificial material filling the cavity by etching the sacrificial material with a first wet etchant which does not substantially remove the layer of tungsten protecting the electronic circuitry.

2. The method of claim 1 wherein the step for etching the cavity within the first portion of the substrate comprises etching the cavity into at least one semiconductor layer formed on the substrate.

3. The method of claim 1 wherein the substrate comprises silicon.

4. The method of claim 1 wherein the step for fabricating the MEM device within the cavity comprises steps for depositing and patterning by etching at least one layer of a micromachineable material selected from the group consisting of polysilicon, silicon dioxide, silicon nitride, silicate glass, metals and metal alloys.

5. The method of claim 4 wherein the step for filling the cavity with a sacrificial material comprises depositing a sacrificial material selected from the group consisting of silicon dioxide and a silicate glass within the cavity to fill the cavity.

6. The method of claim 1 wherein the step for fabricating the MEM device includes a step for annealing the MEM device, thereby relieving stress therein.

7. The method of claim 1 further including a step for planarizing the substrate prior to the step for fabricating the electronic circuitry.

8. The method of claim 1 wherein the step for fabricating the electronic circuitry comprises steps for fabricating a plurality of transistors selected from the group consisting of CMOS transistors, BiCMOS transistors, and bipolar transistors.

9. The method of claim 1 wherein the step for depositing the layer of tungsten comprises depositing the layer of tungsten by chemical vapor deposition.

10. The method of claim 1 wherein the layer of tungsten is deposited to a layer thickness of about 0.1–1 microns.

11. The method of claim 1 wherein the step for protecting the electronic circuitry further comprises a step for depositing an adhesion layer over the second portion of the substrate prior to the step for depositing the layer of tungsten.

12. The method of claim 11 wherein the adhesion layer comprises a layer of titanium nitride.

13. The method of claim 12 wherein the titanium nitride layer is deposited to a layer thickness of about 50 nanometers.

14. The method of claim 12 further including a step for removing the layers of tungsten and titanium nitride after the step for releasing the MEM device.

15. The method of claim 1 wherein the first wet etchant comprises hydrofluoric acid (HF).

16. The method of claim 15 wherein the first wet etchant further comprises hydrochloric acid (HCl).

17. The method of claim 1 further including a step for removing the layer of tungsten after the step for releasing the MEM device.

18. The method of claim 17 wherein the step for removing the layer of tungsten comprises exposing the layer of tungsten to a second wet etchant having a chemical composition different from the chemical composition of the first wet etchant.

19. The method of claim 18 wherein the second wet etchant comprises hydrogen peroxide.

20. A method for integrating a microelectromechanical (MEM) device with electronic circuitry on a substrate comprising steps for:
   (a) fabricating the MEM device at least in part within or from a cavity formed in a first portion of the substrate and encapsulating the MEM device with a sacrificial material;
   (b) fabricating the electronic circuitry in a second portion of the substrate, and interconnecting the electronic circuitry to the MEM device;
   (c) depositing layers of titanium nitride and tungsten over the electronic circuitry for protecting the electronic circuitry from exposure to a first wet etchant comprising, at least in part, hydrofluoric acid; and
   (d) releasing the MEM device for operation by etching away at least a portion of the sacrificial material encapsulating the MEM device with the first wet etchant.

21. The method of claim 20 wherein the substrate comprises silicon.

22. The method of claim 20 further including a step for annealing the encapsulated MEM device for relieving stress therein.

23. The method of claim 20 further including a step for planarizing the substrate prior to the step for fabricating the electronic circuitry.

24. The method of claim 20 wherein the step for fabricating the MEM device comprises steps for etching a cavity into the substrate, depositing a plurality of material layers into the cavity, and patterning by etching at least one of the material layers.

25. The method of claim 24 wherein the material layers comprise micromachineable materials selected from the group consisting of polysilicon, silicon dioxide, silicon nitride, silicate glass, metals and metal alloys.

26. The method of claim 20 wherein the step for fabricating the MEM device comprises steps for etching a cavity into a semiconductor layer formed above the substrate, depositing a plurality of material layers into the cavity, and patterning by etching at least one of the material layers.

27. The method of claim 26 wherein the material layers comprise micromachineable materials selected from the group consisting of polysilicon, silicon dioxide, silicon nitride, silicate glass, metals and metal alloys.

28. The method of claim 20 wherein the sacrificial material comprises silicon dioxide or a silicate glass.

29. The method of claim 20 wherein the step for fabricating the electronic circuitry comprises steps for fabricating a plurality of transistors selected from the group consisting of CMOS transistors, BiCMOS transistors, and bipolar transistors.

30. The method of claim 20 wherein the step for depositing layers of titanium nitride and tungsten over the electronic circuitry comprises depositing the layers of titanium nitride and tungsten by deposition processes selected from the group consisting of sputter deposition and chemical vapor deposition.

31. The method of claim 20 wherein the layer of titanium nitride is about 50 nanometers thick.

32. The method of claim 20 wherein the layer of tungsten is about 0.1–1 microns thick.

33. The method of claim 20 further including a step for removing the layers of titanium nitride and tungsten after the step for releasing the encapsulated MEM device.

34. The method of claim 33 wherein the step for removing the layers of titanium nitride and tungsten comprises exposing the layers of titanium nitride and tungsten to a second wet etchant having a chemical composition different from the chemical composition of the first wet etchant.

35. The method of claim 34 wherein the second wet etchant comprises, at least in part, hydrogen peroxide.

36. A method for integrating a microelectromechanical (MEM) device with electronic circuitry on a substrate comprising steps for:

(a) fabricating the MEM device at least in part within or from a cavity formed in a first portion of the substrate and encapsulating the MEM device with a sacrificial material;

(b) planarizing the substrate to remove any of the sacrificial material extending upward beyond the cavity thereby providing a substantially planar upper surface for the substrate;

(c) fabricating the electronic circuitry in a second portion of the substrate, and interconnecting the electronic circuitry to the MEM device;

(d) protecting the electronic circuitry by depositing layers of titanium nitride and tungsten over the electronic circuitry in the second portion of the substrate;

(e) releasing the MEM device by exposing the MEM device to a first wet etching comprising, at least in part, hydrofluoric acid for sufficient time to remove a portion of the sacrificial material encapsulating the MEM device; and (f) removing the deposited layers of titanium nitride and tungsten protecting the electronic circuitry.

37. The method of claim 36 wherein the step for fabricating the MEM device comprises steps for etching a cavity into the substrate, depositing a plurality of material layers into the cavity, and patterning by etching at least one of the material layers.

38. The method of claim 37 wherein the substrate comprises silicon, and the material layers comprise micromachineable materials selected from the group consisting of polysilicon, silicon dioxide, silicon nitride, silicate glass, metals and metal alloys.

39. The method of claim 36 further including a step for annealing the MEM device for relieving stress therein.

40. The method of claim 36 wherein the electronic circuitry comprises a plurality of transistors.

41. The method of claim 40 wherein the transistors are selected from the group consisting of CMOS transistors, BiCMOS transistors, and bipolar transistors.

42. The method of claim 36 wherein the step for removing the deposited layers of titanium nitride and tungsten comprises exposing the layers of titanium nitride and tungsten to a second wet etchant having a chemical composition different from the chemical composition of the first wet etchant.

43. The method of claim 42 wherein the second wet etchant comprises, at least in part, hydrogen peroxide.

* * * * *